US008803585B2

(12) United States Patent
Olson et al.

(10) Patent No.: US 8,803,585 B2
(45) Date of Patent: Aug. 12, 2014

(54) DUAL PATH LEVEL SHIFTER

(71) Applicant: Peregrine Semiconductor Corporation, San Diego, CA (US)

(72) Inventors: Chris Olson, Chicago, IL (US); Neil Calanca, Crown Point, IN (US)

(73) Assignee: Peregrine Semiconductor Corporation, San Diego, CA (US)

( * ) Notice: Subject to any disclaimer, the term of this patent is extended or adjusted under 35 U.S.C. 154(b) by 0 days.

(21) Appl. No.: 13/867,912

(22) Filed: Apr. 22, 2013

(65) Prior Publication Data
US 2013/0241624 A1 Sep. 19, 2013

Related U.S. Application Data

(63) Continuation of application No. 12/657,857, filed on Jan. 28, 2010, now Pat. No. 8,441,299.

(51) Int. Cl.
*H03L 5/00* (2006.01)

(52) U.S. Cl.
USPC ......................................... 327/333

(58) Field of Classification Search
None
See application file for complete search history.

(56) References Cited

U.S. PATENT DOCUMENTS

| | | | | |
|---|---|---|---|---|
| 5,751,746 | A | 5/1998 | Strauss | |
| 7,304,524 | B2 * | 12/2007 | Fujimoto | 327/333 |
| 7,511,553 | B2 * | 3/2009 | Nuebling | 327/333 |
| 7,564,289 | B2 * | 7/2009 | Imura | 327/333 |
| 7,579,870 | B2 | 8/2009 | Matsumoto et al. | |
| 7,642,819 | B1 * | 1/2010 | Escobar-Bowser et al. | 327/110 |
| 7,764,090 | B2 * | 7/2010 | Yamashita et al. | 327/108 |
| 7,920,012 | B2 * | 4/2011 | Kiritani et al. | 327/333 |
| 8,441,299 | B2 | 5/2013 | Olson et al. | |
| 2002/0000847 | A1 * | 1/2002 | Taguchi | 327/108 |
| 2004/0056700 | A1 * | 3/2004 | Amick et al. | 327/333 |
| 2004/0263233 | A1 * | 12/2004 | Dupuy et al. | 327/333 |
| 2005/0052215 | A1 * | 3/2005 | Ohshima et al. | 327/333 |
| 2005/0088218 | A1 * | 4/2005 | Shibata et al. | 327/333 |
| 2005/0206433 | A1 * | 9/2005 | Liu | 327/333 |
| 2005/0218958 | A1 * | 10/2005 | Ajram et al. | 327/333 |
| 2006/0049859 | A1 * | 3/2006 | Hwang et al. | 327/108 |
| 2007/0146042 | A1 * | 6/2007 | Tsuchi et al. | 327/333 |
| 2008/0265970 | A1 | 10/2008 | Vlasenko | |
| 2008/0265973 | A1 * | 10/2008 | Yamashita et al. | 327/333 |
| 2009/0224816 | A1 * | 9/2009 | Bittner et al. | 327/333 |
| 2009/0224818 | A1 * | 9/2009 | Yoneyama et al. | 327/333 |
| 2011/0181338 | A1 | 7/2011 | Olson et al. | |

OTHER PUBLICATIONS

Almo, Khareem, Office Action received from the USPTO dated Sep. 6, 2011 for related U.S. Appl. No. 12/657,857, 13 pgs.
Olson, et al., Response filed in the USPTO dated Jan. 5, 2012 for related U.S. Appl. No. 12/657,857, 9 pgs.
Almo, Khareem, Office Action received from the USPTO dated Mar. 19, 2012 for related U.S. Appl. No. 12/657,857, 14 pgs.
Olson, et al., Response filed in the USPTO dated Jun. 19, 2012 for related U.S. Appl. No. 12/657,857, 11 pgs.

(Continued)

*Primary Examiner* — Lincoln Donovan
*Assistant Examiner* — Khareem E Almo
(74) *Attorney, Agent, or Firm* — Jaquez Land Richman LLP; Martin J. Jaquez, Esq.; Alessandro Steinfl, Esq.

(57) ABSTRACT

Dual path level shifter methods and devices are described. The described level shifter devices can comprise voltage-to-current and current-to-voltage converters.

27 Claims, 13 Drawing Sheets

(56) References Cited

OTHER PUBLICATIONS

Almo, Khareem, Final Office Action received from the USPTO dated Sep. 19, 2012 for related U.S. Appl. No. 12/657,857, 13 pgs.

Olson, et al., Response filed in the USPTO dated Dec. 19, 2012 for related U.S. Appl. No. 12/657,857, 7 pgs.

Almo, Khareem, Notice of Allowance received from the USPTO dated Jan. 11, 2013 for related U.S. Appl. No. 12/657,857, 7 pgs.

Olson, et al., Comments on Examiner's Statement of Reasons for Allowance filed in the USPTO dated Apr. 11, 2013 for related U.S. Appl. No. 12/657,857, 3 pgs.

* cited by examiner

DUAL PATH LEVEL SHIFTER

CROSS REFERENCE TO RELATED APPLICATION-CLAIM OF PRIORITY

The present application is a continuation of commonly owned U.S. patent application Ser. No. 12/657,857 filed on Jan. 28, 2010, incorporated herein by reference in its entirety.

BACKGROUND

Field

The present disclosure relates to level shifter circuits. More particularly, the present disclosure relates to a dual path level shifter circuit.

SUMMARY

According to a first aspect, a dual path level shifter is provided, comprising: a dual path level shifter input terminal, a dual path level shifter output terminal, a first voltage-to-current converter, a second voltage-to-current converter, a third voltage-to-current converter, a first current-to-voltage converter, and a second current-to-voltage converter, wherein: in a first condition, during operation, an input signal having an input signal level is routed from the dual path level shifter input terminal to the first voltage-to-current-converter, from the first voltage-to-current-converter to the second current-to-voltage-converter, from the second current-to-voltage converter to the third voltage-to-current converter, from the third voltage-to current-converter to the first current-to-voltage converter and from the first current-to-voltage converter to the dual path level shifter output terminal, and in a second condition, during operation, the input signal is routed from the dual path level shifter input terminal to the second voltage-to-current converter, from the second voltage-to-current converter to the first current-to-voltage converter and from the first current-to-voltage converter to the dual path level shifter output terminal, whereby the input signal level is shifted to an output signal level.

According to a second aspect, a level shifting method is provided, comprising: providing an input signal having an input signal level, providing an output terminal, providing a first signal path comprising a plurality of MOSFET devices, providing a second signal path comprising a plurality of MOSFET devices, routing, in a first condition, the input signal to the output terminal through the first signal path without shifting the input signal level, and routing, in a second condition, the input signal to the output terminal through the second signal path by shifting the input signal level to an output signal level higher than the input signal level, wherein in the first and second condition, the MOSFET devices are configured such that junctions of each MOSFET device experience voltage levels not higher than a stress threshold level.

According to a third aspect, a level shifting method is provided comprising: providing an input signal having an input signal level, providing an output terminal, providing a first signal path comprising a plurality of MOSFET devices, providing a second signal path comprising a plurality of MOSFET devices, routing, in a first condition, the input signal to the output terminal, and routing, in a second condition, the input signal to the output terminal and shifting the input signal level to an output signal level higher than the input signal level, wherein in the first condition and second condition, the MOSFET devices are configured such that junctions of each MOSFET device experience voltage levels not higher than the input signal level.

According to a fourth aspect, A level shifter circuit is provided, comprising: a first input terminal, a second input terminal, a third input terminal and an output terminal, wherein the first input terminal receives, in operation, an input signal swinging up to a first signal level, the second input terminal receives, in operation, a control signal swinging up to a second signal level higher than the first signal level, the third input terminal receives, in operation, a pumping signal swinging between the first signal level and a third signal level higher than the second signal level, and the output terminal outputs, in operation, an output signal swinging between the second signal level and the third signal level when the control signal is at the second signal level and the pumping signal is at the third signal level.

According to a fifth aspect, a circuit is provided, comprising: a plurality of stacked MOSFET devices, an input terminal connected with a gate of a first device of the plurality of MOSFET devices, a level shifter having a first input connected with the input terminal and an output connected with a gate of a second device of the plurality of MOSFET devices, a level shifter having a first input connected with the input terminal and an output connected with a gate of a second device of the plurality of MOSFET devices; an output terminal connected with a source of the second device and with the level shifter as a second input to the level shifter; and a bootstrapping capacitor connected between the output terminal on a first side and i) a gate of a third device of the plurality of MOSFET devices and ii) the level shifter as a third input to the level shifter on a second side.

According to a sixth aspect, a dual path level shifter is provided, comprising: a dual path level shifter input terminal, a dual path level shifter output terminal, a first current-to-voltage converter, a second current-to-voltage converter, a third current-to-voltage converter, a first voltage-to-current converter, and a second voltage-to-current converter, wherein in a first condition, during operation, an input signal having a first signal level is routed from the dual path level shifter input terminal to the first current-to-voltage converter and from the first current-to-voltage converter to the second voltage-to-current converter and from the second voltage-to-current converter to the third current-to-voltage converter and from the third current-to voltage converter to the first voltage-to-current converter and from the first voltage-to-current converter to the dual path level shifter output terminal, and in a second condition, during operation, the input signal is routed from the dual path level shifter input terminal to the second current-to-voltage converter and from the second current-to-voltage converter to the first voltage-to current converter and from the first voltage-to-current converter to the dual path level shifter output terminal; wherein the input signal level is shifted to an output signal level.

Further aspects of the present disclosure are shown in the description, drawings and claims of the present application.

BRIEF DESCRIPTION OF THE DRAWINGS

The accompanying drawings, which are incorporated into and constitute a part of this specification, illustrate one or more embodiments of the present disclosure and, together with the detailed description and the examples, serve to explain the principles and implementations of the disclosure.

Like reference numbers and designations in the various drawings indicate like elements.

DETAILED DESCRIPTION

A level shifter is a circuit which receives an input signal at one voltage level and generates a corresponding output signal at a different voltage level. The level shifter output signal can generally have a smaller or larger value than the level shifter input signal.

Figure 1:
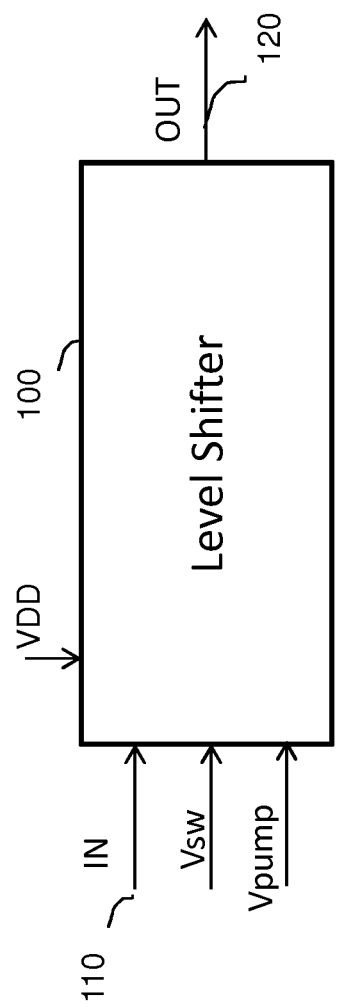
FIG. 1 shows a high level block diagram of a level shifter.

FIG. 1 shows a high level block diagram of a level shifter circuit (100) in accordance with an embodiment of the disclosure. The level shifter circuit (100) comprises an input terminal (110) where an input signal IN is received and an output terminal (120) where an output signal OUT is generated. A control signal Vsw is shown in FIG. 1. The control signal Vsw has two states, e.g. HIGH and LOW. According to an embodiment of the disclosure, the control signal Vsw decides a signal path from the input terminal (110) to the output terminal (120) of the level shifter (100), as explained in the following sections. Further shown in FIG. 1, is a signal Vpump which is described later. The level shifter (100) show in FIG. 1 is also supplied by a power supply having a voltage level VDD.

Figure 2:
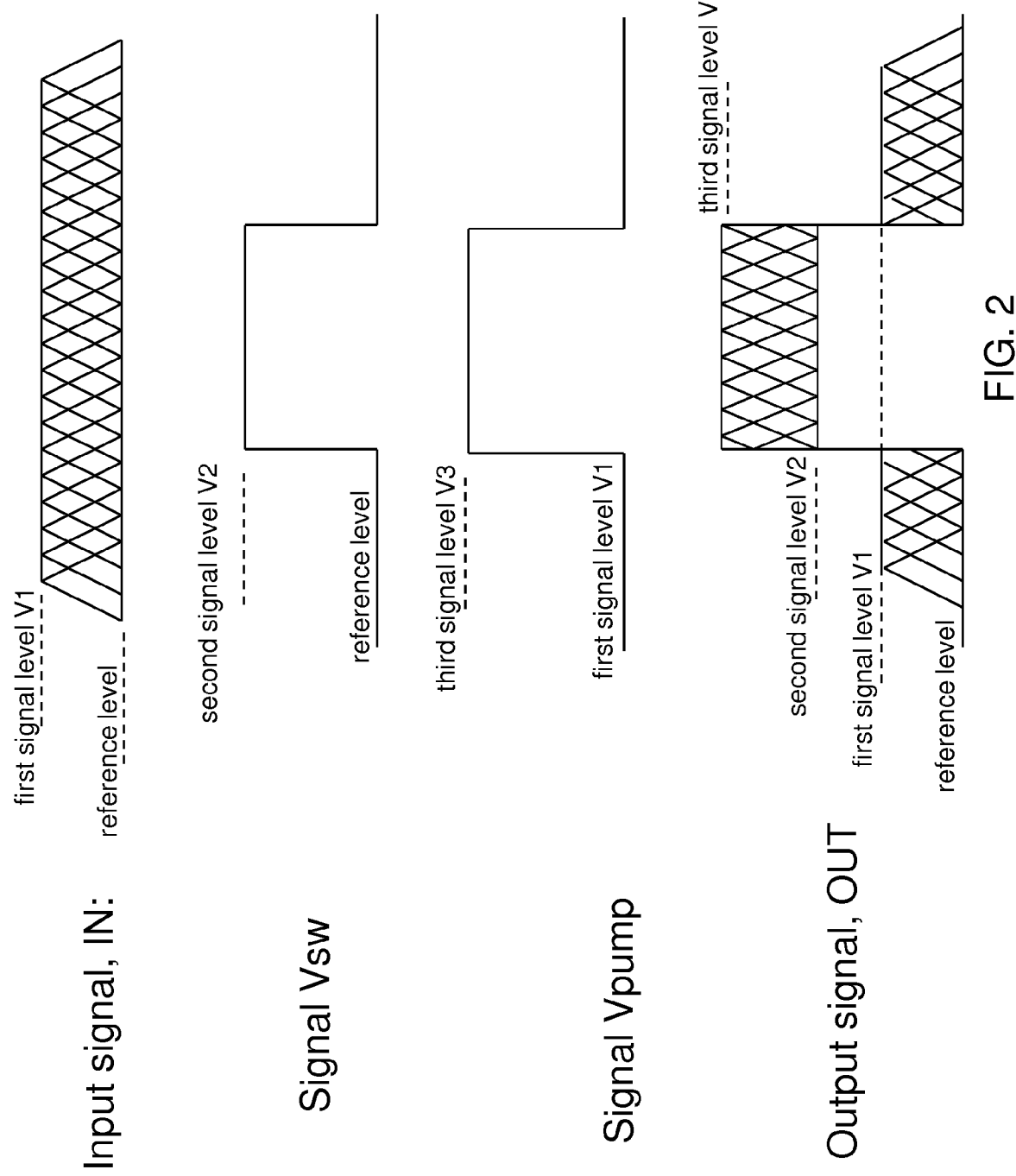
FIG. 2 shows a waveform diagram showing the input-output characteristics of the level shifter in FIG. 1.

FIG. 2 is a waveform diagram showing an embodiment of the input and output characteristics of the level shifter shown in FIG. 1. As show in FIG. 2, the input signal IN swings between a reference signal (e.g., GND) and a first signal level V1 (e.g., 0.5 VDD). As mentioned previously in reference to FIG. 1, the control signal Vsw has two states LOW and HIGH respectively represented by the reference level and a second signal level V2 (e.g., VDD) in FIG. 2. Further referring to FIG. 2, the signal Vpump swings between the first signal level and a third signal level V3 (e.g., V3). According to an embodiment of the disclosure, the third signal level V3 is larger than the second signal level V2 which is in turn larger than the first signal level V1. As shown in FIG. 2, when the control signal Vsw is in LOW state, the input signal IN is routed to the output terminal (120). In other words, the output signal OUT is the same as the input signal IN. On the other hand, when the control signal Vsw is in HIGH state, the output signal OUT is a replicated version of the input signal IN but swinging between the second signal level V2 (e.g., VDD) and the third signal level V3 (e.g., 1.5 VDD). According to an embodiment of the disclosure, the signal Vpump provides the third signal level V3, larger than the power supply level VDD, to the level shifter circuit (100). Therefore, the output signal OUT is either the same as the input signal IN or a shifted version of the same, depending on the state of the control signal Vsw. A combination of the signal Vpump and the signal Vsw indicates a shifting level of the input signal IN, as later described in additional detail.

Figure 3:
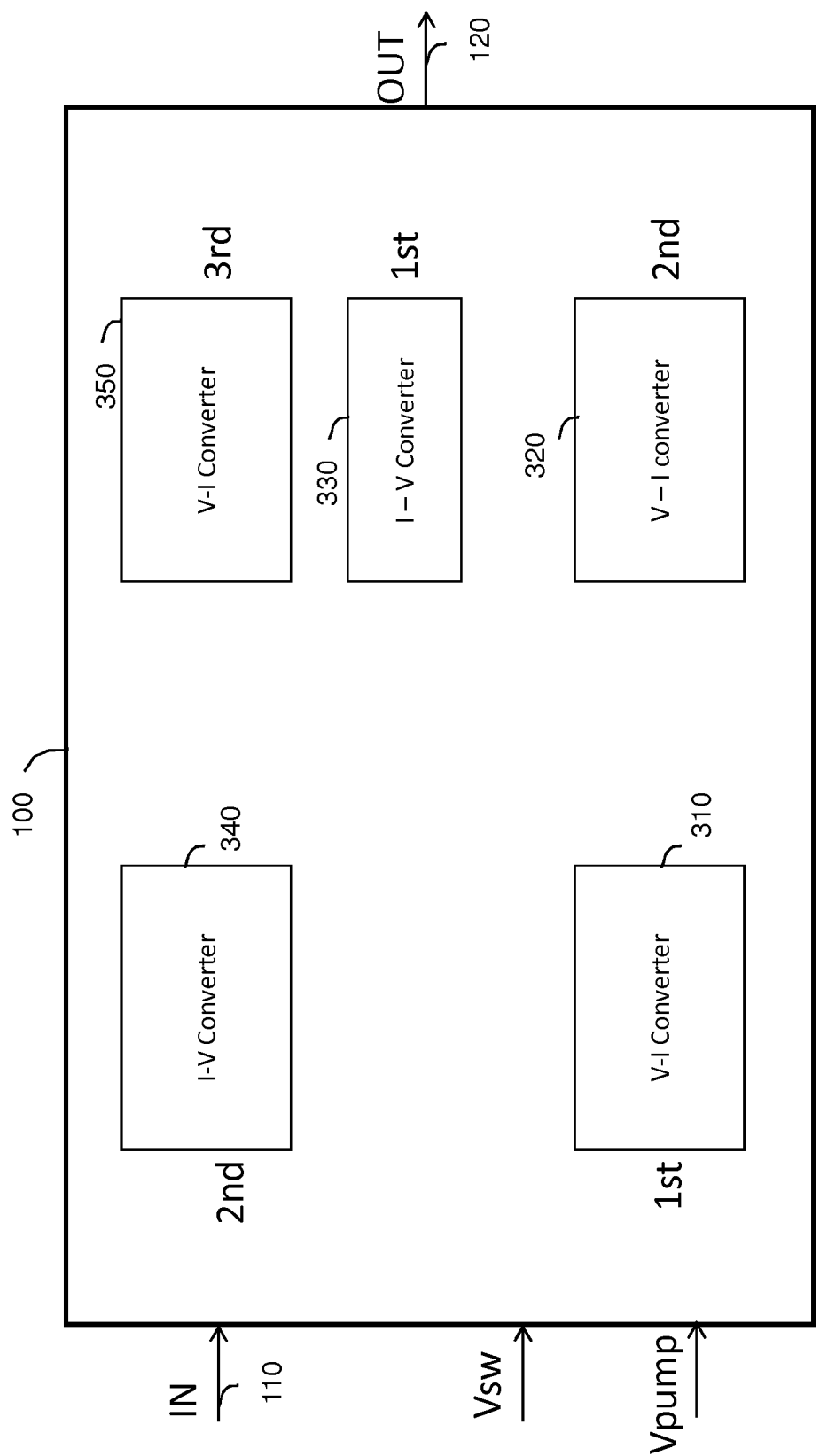
FIG. 3 shows a more detailed block diagram of the level shifter in FIG. 1 according to an embodiment of the disclosure.

FIG. 3 shows a more detailed block diagram of the level shifter (100) in accordance with an embodiment of the disclosure. As shown in FIG. 3, the level shifter (100) comprises three Voltage to Current (VI) converters (310, 320, 350) and two Current to Voltage (IV) converters (330, 340). The first VI converter (310) is shown on the bottom left of FIG. 3, the second VI converter (320) is shown on the bottom right of FIG. 3, the third VI converter (350) is shown on the top right of FIG. 3, the first IV converter (330) is shown on the right and the second IV converter (340) is shown on the left of this figure.

FIGS. 4A-and 4B show two signal paths from the input to output of the level shifter (100) during an operative condition of the level shifter (100). FIG. 4A shows a first signal path and FIG. 4B shows a second signal path. In accordance with an embodiment of the disclosure, the first signal path (410) establishes a first input-output connection by routing the input signal IN through the second VI converter (320) and the first IV converter (330). The second signal path (420) establishes a second input-output connection by routing the input signal IN through the first VI converter (310), the second IV converter (340), the third VI converter (350) and the first IV converter (330). When the control signal Vsw is in a first state (for example HIGH), the first signal path (410) is chosen and when the control signal Vsw is in a second state (for example LOW), the second signal path (420) is chosen. As described later, provision of two different signal paths allows to prevent voltage stress on devices used to establish the first and the second signal paths.

Figure 4:
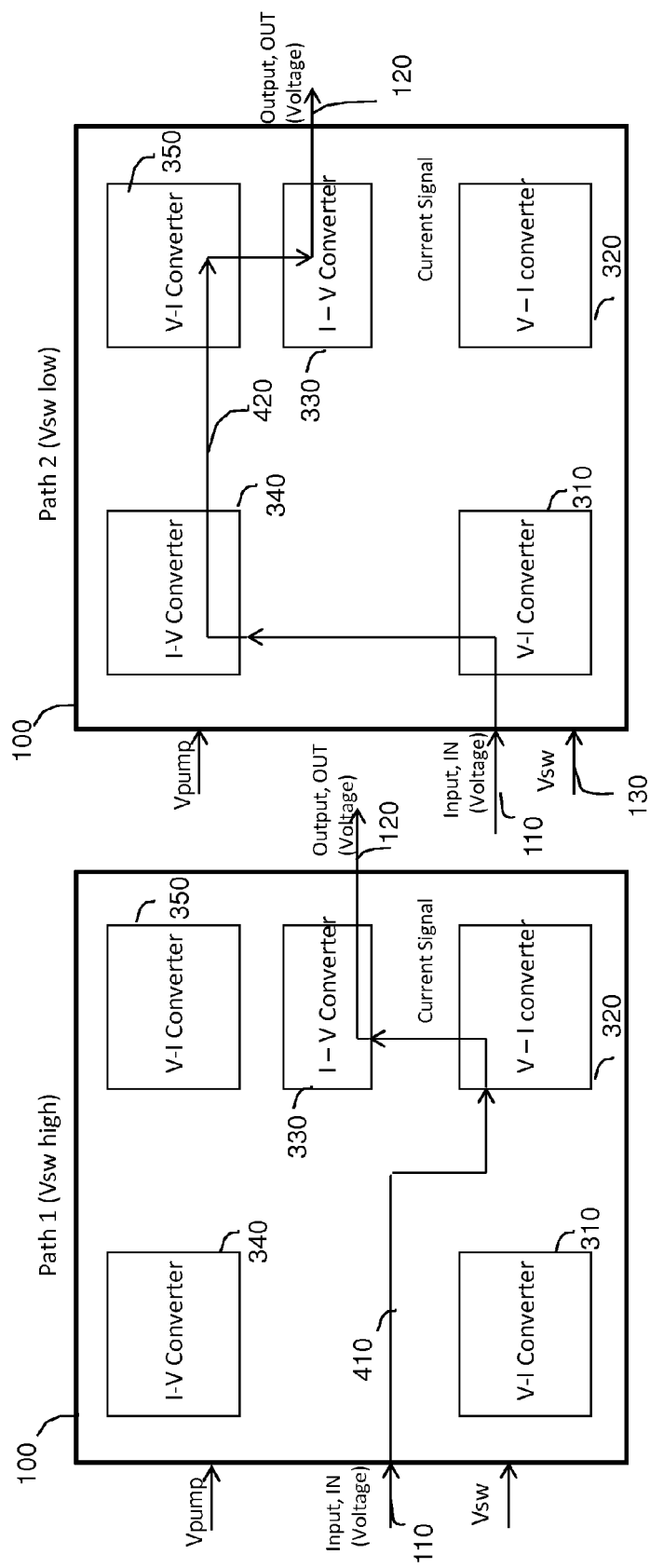
FIGS. 4A and 4B are same block diagrams as that of FIG. 3 showing respectively a first and a second signal path from input to output.
Figure 5:
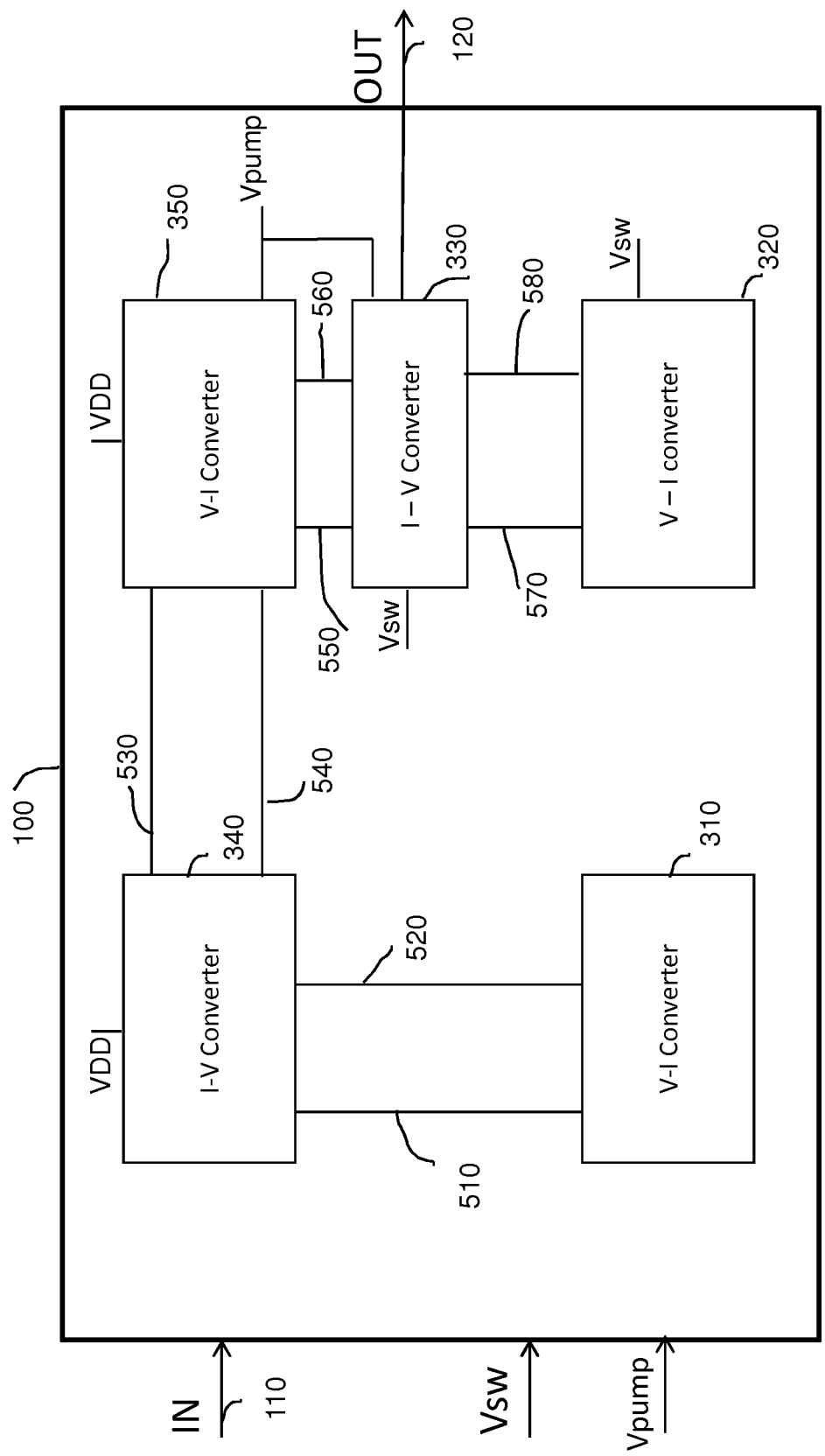
FIG. 5 shows a detailed block diagram of a level shifter according to an embodiment of the disclosure showing physical connections between voltage-current and current-voltage converters.

FIG. 5 shows physical connections between the blocks shown in FIG. 4. According to an embodiment of the disclosure, the VI converter (310) is connected to the IV converter (340) through signal paths (510) and (520). The IV converter (340) is connected to the VI connector (350) through signal paths (540) and (530). The VI converter (350) is connected to the IV connector (330) through the signal paths (550) and (560) and the IV converter (330) is connected to the VI converter (320) through the signal paths (570) and (580).

Figure 6:
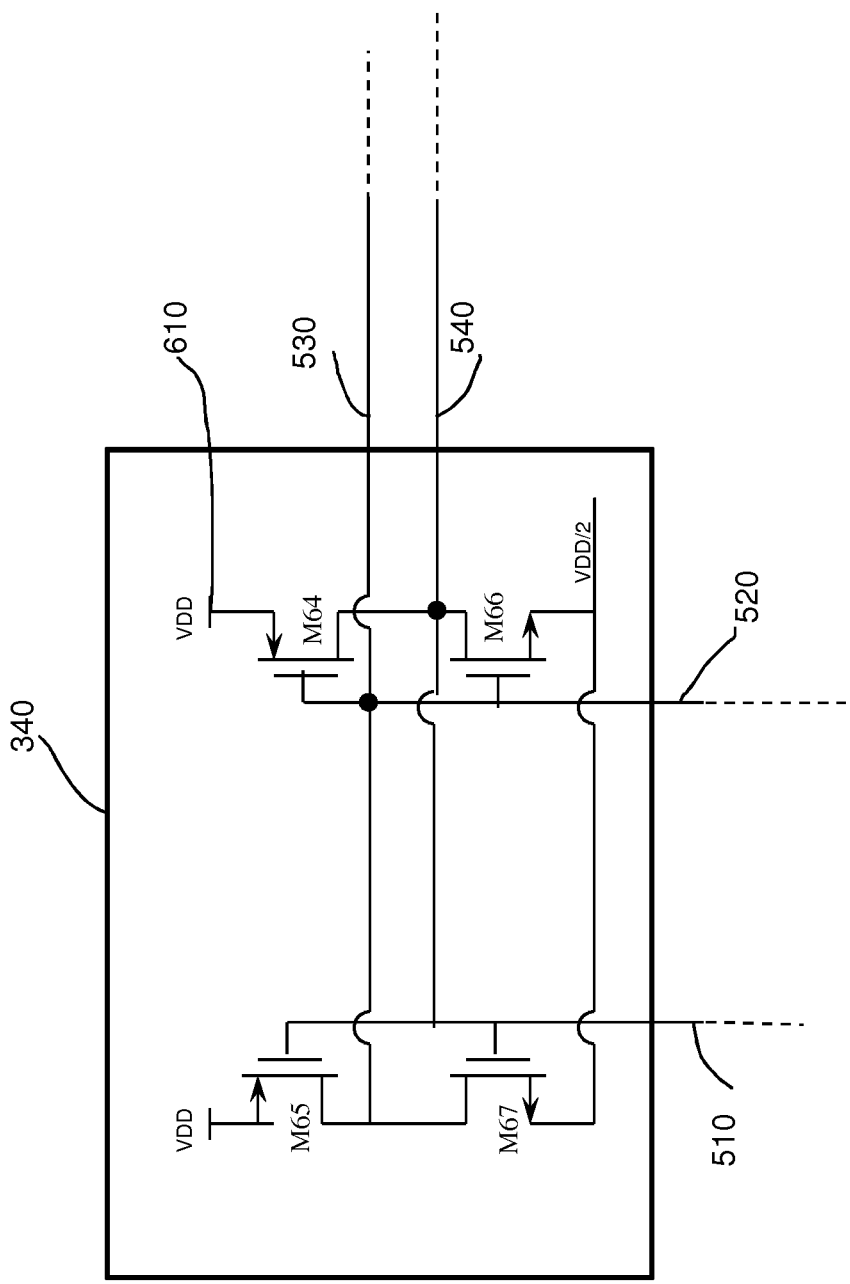
FIG. 6 shows a circuit schematic of a second current-voltage converter according to an embodiment of the disclosure.
Figure 12:
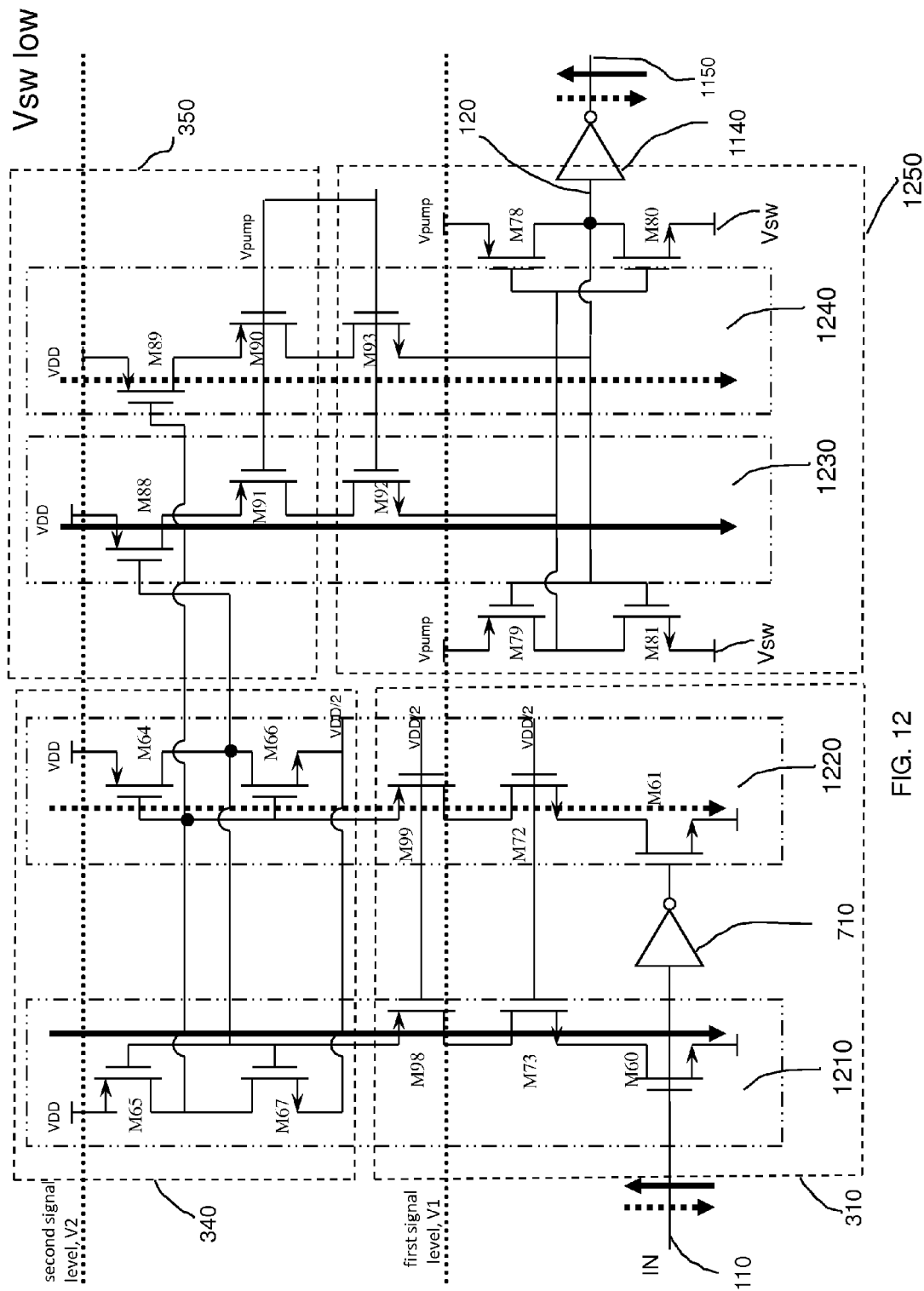
FIG. 12 shows an equivalent circuit schematic of a level shifter according to an embodiment of the disclosure when the control signal Vsw is in a second condition.

FIG. 6 shows a detailed circuit diagram of the second IV converter (340). According to an embodiment of the disclosure, the second IV converter (340) includes two NMOS devices (M67, M66) and two PMOS devices (M64, M65). The four devices (M64, M65, M66, M67) are configured as a cross coupled inverter a shown in FIG. 6. The cross coupled inverter serves as a first latch. The role of the first latch is to hold signal levels in the signal paths (530, 540) when the input signal Vsw is going through a transition. This prevents the circuit from being in an unknown state when the transition ends. As will be explained later in the text (see FIG. 12) and according to an embodiment of the disclosure, the first latch is only active when the switching voltage Vsw is in the condition LOW. According to an embodiment of the disclosure, the second IV converter (340) uses VDD as power source (610). Signal paths (510, 520) and (530, 540) connecting the second converter (340) to respectively the first VI converter (310) and the third VI converter (350) are also shown in FIG. 6. According to the embodiment of the disclosure and as explained more in detail later in the text, the second IV converter (340) is only active when the input control signal Vsw is in condition LOW. Reference can also be made to FIG. 12, later described.

Figure 7:
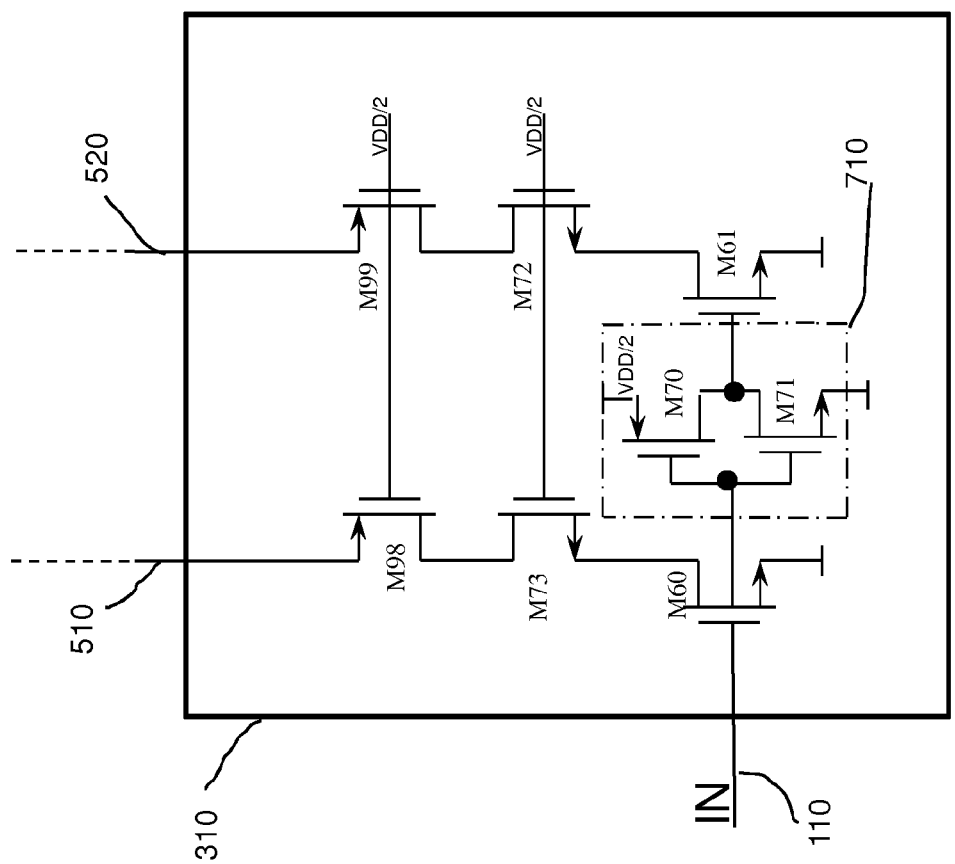
FIG. 7 shows a circuit schematic of a first voltage-current converter according to an embodiment of the disclosure.

FIG. 7 shows a detailed circuit diagram of the first VI converter (310). According to an embodiment of the disclosure, the first VI converter (310) includes five NMOS devices (M60, M61, M71, M72, M73) and three PMOS devices (M98, M99, M70). Devices (M70) and (M71) are configured as an inverter (710). According to an embodiment of the disclosure and as explained more in detail later in the text, the first VI converter (310) is only active when the control input signal Vsw is in state LOW. Devices (M72, M73, M98, M99) are cascode devices and are used for protection against over stressing and as explained in more detail later in the text (see FIG. 12). Devices (M60, M61) are described more in detail later in the text (see FIG. 12).

Figure 8:
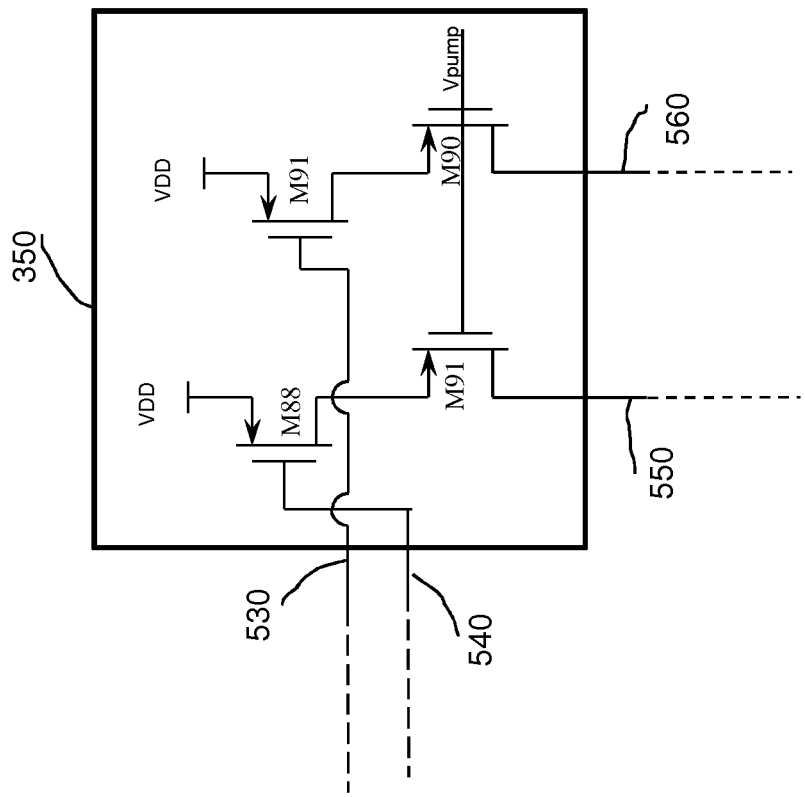
FIG. 8 shows a circuit schematic of a third voltage-current converter according to an embodiment of the disclosure.

FIG. 8 shows a detailed circuit diagram of the third VI converter (350). According to an embodiment of the disclosure, the third VI converter (350) includes four PMOS devices that use VDD (610) as power source. The third VI converter (350) is only active when the input control signal Vsw is in state LOW. The third VI converter (350) provides the current to the first IV converter (330) (see FIG. 12).

Figure 9:
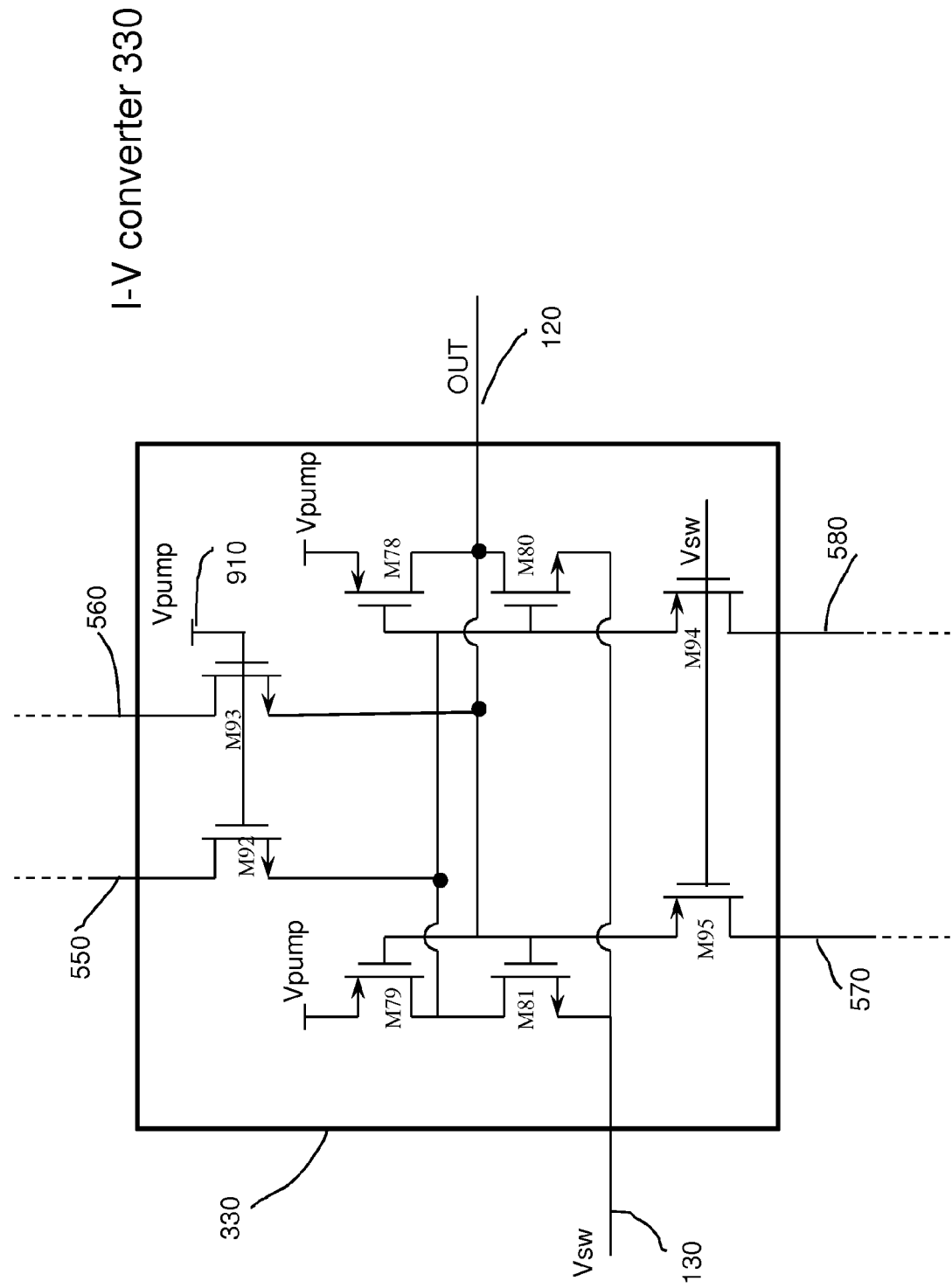
FIG. 9 shows a circuit schematic of a first current-voltage converter according to an embodiment of the disclosure.

FIG. 9 shows a detailed circuit diagram of the first IV converter (330). According to the embodiment of the disclosure, the first IV converter (330) includes five NMOS devices (M80, M81, M92, M93, M97) and four PMOS devices (M94, M95, M78, M79). Gates of devices (M92) and (M93) are connected to signal Vpump. Devices (M78, M79, M80, M81) form a cross coupled inverter that serves as a second latch. The role of the second latch is to hold signal levels at the output OUT (120) when the input signal Vsw is going through a transition. This prevents the circuit from being in an unknown state when the transition ends. As opposed to the first latch, the second latch is active when the control input signal Vsw is in any state HIGH or LOW (see FIG. 11-12 for a more detailed description).

Figure 10:
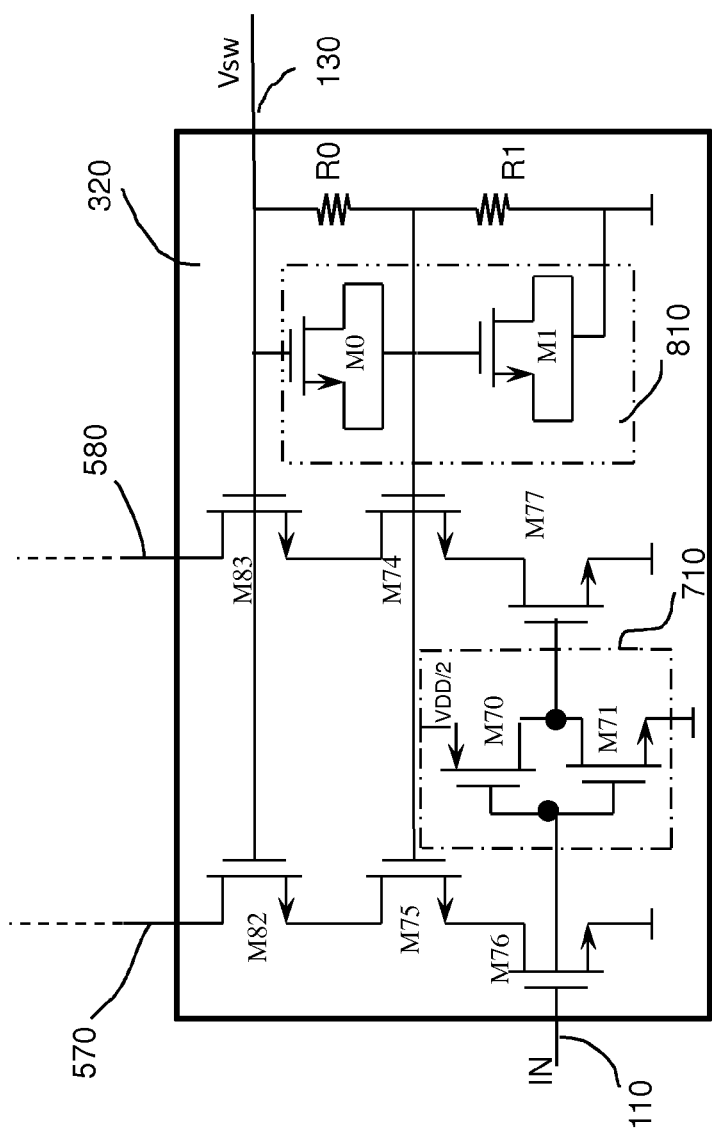
FIG. 10 shows a circuit schematic of a second VI converter according to an embodiment of the disclosure.

FIG. 10 shows a detailed circuit diagram of the second VI converter (320). According to an embodiment of the disclosure, the second VI converter (320) includes nine NMOS devices (M71, M76, M77, M74, M75, M82, M83, M1, M0) and one PMOS device (M70). Devices (M1, M0) are configured to serve as capacitive elements. A leg (810) comprising the capacitive elements (M1, M0) is also shown in FIG. 10. Combination of (M0, M1) and resistors (R0, R1) provides a voltage divider that is used to protect devices (M74, M75). (see FIG. 11-12 for more detailed description).

Figure 11:
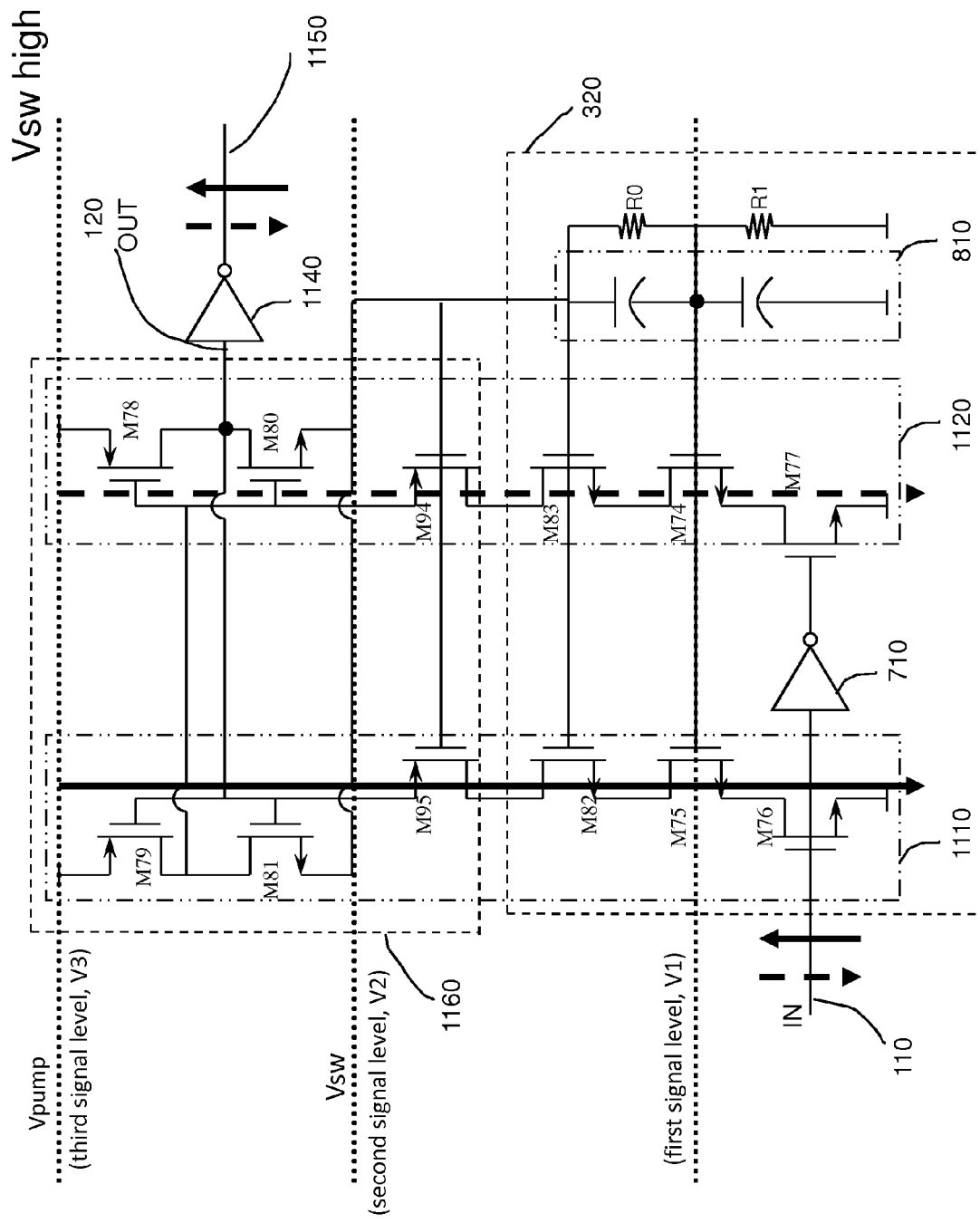
FIG. 11 shows an equivalent circuit schematic of a level shifter according to an embodiment of the disclosure and when a control signal Vsw is in a first condition.

According to an embodiment of the disclosure, FIG. 11 shows details of the portion of the level shifter circuit defining the first signal path which routes the input signal IN to the output terminal (120). An output inverter (1140) is shown in FIG. 11. For sake of simplicity, leg (810) is shown with capacitor symbols representing the capacitive elements shown in FIG. 9. The inverter (1140) is an example of a separate circuit that can be connected to the level shifter. When the input control signal Vsw is in HIGH state, devices (M90, M91, M92, M93) turn off. Therefore all devices in the third VI converter will be off. Following the connections (530, 540) between the third VI converter (350) and the second IV converter (340) and the connections (510, 520) between the second IV converter (340) and the first VI converter (310), it can be seen that all devices in the second IV converter (340) and the first VI converter (310) will also be off. Therefore, according to an embodiment of the disclosure, FIG. 11 shows an equivalent circuit diagram of the level shifter (100) when the input control signal Vsw is in state HIGH. A portion of the first IV converter (330) is represented by a block (1160).

Referring to FIG. 9 and according to an embodiment of the present disclosure, when the input signal Vsw is in HIGH state, devices (M92, M93) are turned off. Therefore, block (1160) represents an equivalent circuit diagram of the first IV converter (330) when the input signal Vsw is HIGH. As shown in FIG. 11, devices (M76, M75, M82, M95, M81, M79) form a first leg (1110) and devices (M77, M74, M83, M94, M80, M78) form a second leg. For the sake of simplicity, the inverter (710) of FIG. 7 is represented by an inverter symbol in FIG. 11. When the input signal IN is LOW (dotted line), device (M76) is turned off. As a result, there is no current flowing in the first leg (1110). The inverter (710) inverts the input signal IN and therefore, device (M77) is in state ON and current is flowing in the second leg (1120). As a result of current increasing in the right leg (1120), the voltage at the gates of the devices (M78) and (M79) will drop and eventually this will turn off the device (M94). Therefore, voltage level at the gates of the devices (M79) and (M81) is in state HIGH and as a result, the output (1150) will be in state LOW due to the inverter (1140). When the device (M94) turns off, the current stops flowing in the second leg (1120) and this prevents the gate voltages of the devices (M78) and (M80) from further dropping. As a result, devices (M78, M80) are protected by the device (M94) from over-voltaging.

Referring to the embodiment shown in FIG. 11, when the input signal is HIGH (solid line), device (M76) is turned on and device (M77) is turned off due to the inverter (710). Current flows in first left leg (1110) until the voltage at the gates of the devices (M79) and (M81) reduces enough to turn the device (M95) off. The input (120) to the output inverter (1240) is then LOW and the output (1150) goes HIGH. When the device (M95) turns off, the current stops flowing in the first leg (1110) and this prevents the gate voltages of the devices (M79) and (M81) from further dropping. As a result, the devices (M79) and (M81) are protected by the device (M95) from overvoltaging.

According to an embodiment of the disclosure, as shown in FIG. 11, a combination of the leg (810) with the resistors (R0, R1) provides a voltage having the first signal level V1 to the gates of the devices (M74, M75). Also, the gates of the devices (M82, M83) are biased at the second signal level V2 and the sources of the devices (M79, M78) are biased with the signal Vpump having the third signal level V3.

With further reference to FIG. 11, by way of example but not limitation, the first signal level V1, the second signal level V2, and the third signal level V3 can be respectively equal to 0.5 VDD, VDD, and 1.5 VDD. Therefore, according to this example, none of the junctions of the devices in the block (320) will experience voltage levels more than 0.5 VDD and as a result, devices with breakdown voltages no more than 0.5 VDD can be used to build this block. In other words, in the embodiment of FIG. 11, the combination of the leg (810) and the resistors R0 and R1 will serve as a voltage divider for the control signal Vsw to bias the gates of the devices (M74, M75) so that the devices (M74, M75) will protect the devices (M76, M77) from over-voltaging. Furthermore, the devices (M75, M82) and (M74, M83) are in a cascode configuration allowing the devices (M82) and (M83) to protect respectively the devices (M75) and (M74) from a voltage stress. Following the same example, as shown in FIG. 11, the sources of the devices (M80, M81) are biased with the second signal level (VDD according to the example) and the sources of the devices (M78, M79) are biased with the third signal level (1.5 VDD according to the example). Therefore, the output signal OUT will swing between the second signal level and a third signal level (between VDD and 1.5 VDD according to the example). In other words, the output signal OUT will be a shifted version of the input signal IN when the control signal Vsw is in HIGH state (VDD according to the example).

FIG. 12 shows details of the portion of the level shifter circuit defining the second signal path which connects the input signal IN to the output OUT (120). The inverter (1140) represents an example of a separate circuit that can be connected to the level shifter. In this respect, reference can be made, for example, to the embodiment of FIG. 13, later discussed. Except for the portion shown, when Vsw is in state LOW, all the remaining devices in the level shifter (100) circuit are turned off regardless of the input signal IN level. Therefore, the diagram shown in FIG. 12 is electrically equivalent to the entire level shifter (100) circuit when Vsw is in state LOW.

Referring to FIG. 10 and according to an embodiment of the disclosure, when the input signal Vsw is in LOW state, devices (M74, M75, M82, M83) are turned off. Therefore, the block (1250) shown in FIG. 12 represents an equivalent circuit diagram of the first IV converter (330) when the input signal Vsw is LOW. According to an embodiment of disclosure, when the input signal IN is low (dotted line), device (M60) is turned off, device (M61) is turned on and current flows in the leg (1220) of FIG. 12. As a result, the voltage at the gates of the devices (M64, M66, M89) will drop and this results in current flowing in the leg (1240) of FIG. 12. As a result of current flowing in the leg (1240) of FIG. 12, device (M81) will be turned on and device (M80) will turn off This will set input (120) to the inverter (1140) of FIGS. 11 and 12 in state HIGH and therefore the output (1150) of the inverter (1140) will be in state LOW. According to an embodiment of the disclosure, when the input signal IN is HIGH (solid line), device (M61) is turned off, device (M60) is turned on and current flows in the leg (1210). As a result, the voltage at gates of the devices (M65, M67, M88) will drop and this results in current flowing in the leg (1230). As a consequence of current flowing in the leg (1230), device (M80) will be turned on and device (M81) will turn off. This will set input (120) to the inverter (1140) in state LOW and therefore the output (1150) of the inverter (1140) will be in state HIGH.

Referring to FIG. 2, the signal Vpump is at the first signal level V1 when the control signal Vsw is in LOW state (e.g., GND). Based on the previous example related to FIG. 11 where the first signal level V1, the second signal level V2 and the third signal level V3 are respectively equal to 0.5 VDD, VDD and 1.5 VDD, it can be seen in FIG. 12, that the output (1150) will be swinging between the reference level (e.g., GND) and 0.5 VDD. This is because the sources of the devices (M78, M79) of FIG. 12 are biased with the signal Vpump which has a voltage level of 0.5 VDD and the sources of the devices (M80, M81) are biased with the control signal Vsw with an amplitude of VDD. In other words, according to the embodiment shown in FIG. 12, when the control signal Vsw is in LOW state, the output (1150) of FIGS. 11-12 will be a copy of the input signal IN. Following the same example and further referring to FIG. 12, the person skilled in the art will appreciate that each of the blocks (340, 310, 1250, 350) are exposed to two voltage levels, the difference of which is 0.5 VDD. In other words, junctions of the devices in the each of the blocks (340, 310, 1250, 350) will experience voltages no more than 0.5 VDD. As an example, the sources of the devices (M64, M65) in the block (340) are biased at VDD and the sources of the devices (M66, M67) are biased at 0.5 VDD and as a result, junctions of devices (M64, M65, M66, M67) will be exposed to voltage levels no more than 0.5 VDD. More importantly, further referring to FIG. 12, when the control signal Vsw is in HIGH state, the blocks (1250, 350) will receive a voltage level of 1.5 VDD as the signal Vpump is at this voltage level. However, since the sources of the devices (M88, M89) in the block (350) are biased with VDD and the sources of the devices (M80, M81) are biased with the signal Vsw (VDD according to the example), again junctions of the devices within the blocks (1250, 350) will be exposed to voltages no more than 0.5 VDD although the output (1150) of FIGS. 11-12 is a shifted version (swinging between VDD and 1.5 VDD) of the input signal IN (swinging between GND and 0.5 VDD).

Further referring to FIG. 12, devices (M73) and (M72) respectively protect the device (M60) and (M61) from over-voltaging (i.e. raising the voltage on the device above its upper design limit) in the same way as was described before, in reference to FIG. 11. Also, devices (M98, M99) provide protection for the devices (M64, M65, M66, M67) shown in FIG. 12. Also, in the same way as described previously in reference to FIG. 11, the devices (M91, 90) protect the devices (M88, M89) and the four devices (M78, M79, M80, M81) are protected by the devices (M92, M93) from being over-voltaged.

Referring to FIG. 2, the signal Vpump is at the first signal level when the control signal Vsw is in LOW state. Referring to FIG. 11, the person skilled in the art will understand that in a case where the control signal Vsw is in LOW state, junctions of the devices shown in FIG. 11 will experience voltage levels less than the first signal level (e.g., 0.5 VDD).

In what follows further embodiments according to the present disclosure will be described, where provision of the control signal Vsw and the signal Vpump is described in detail.

Figure 13:
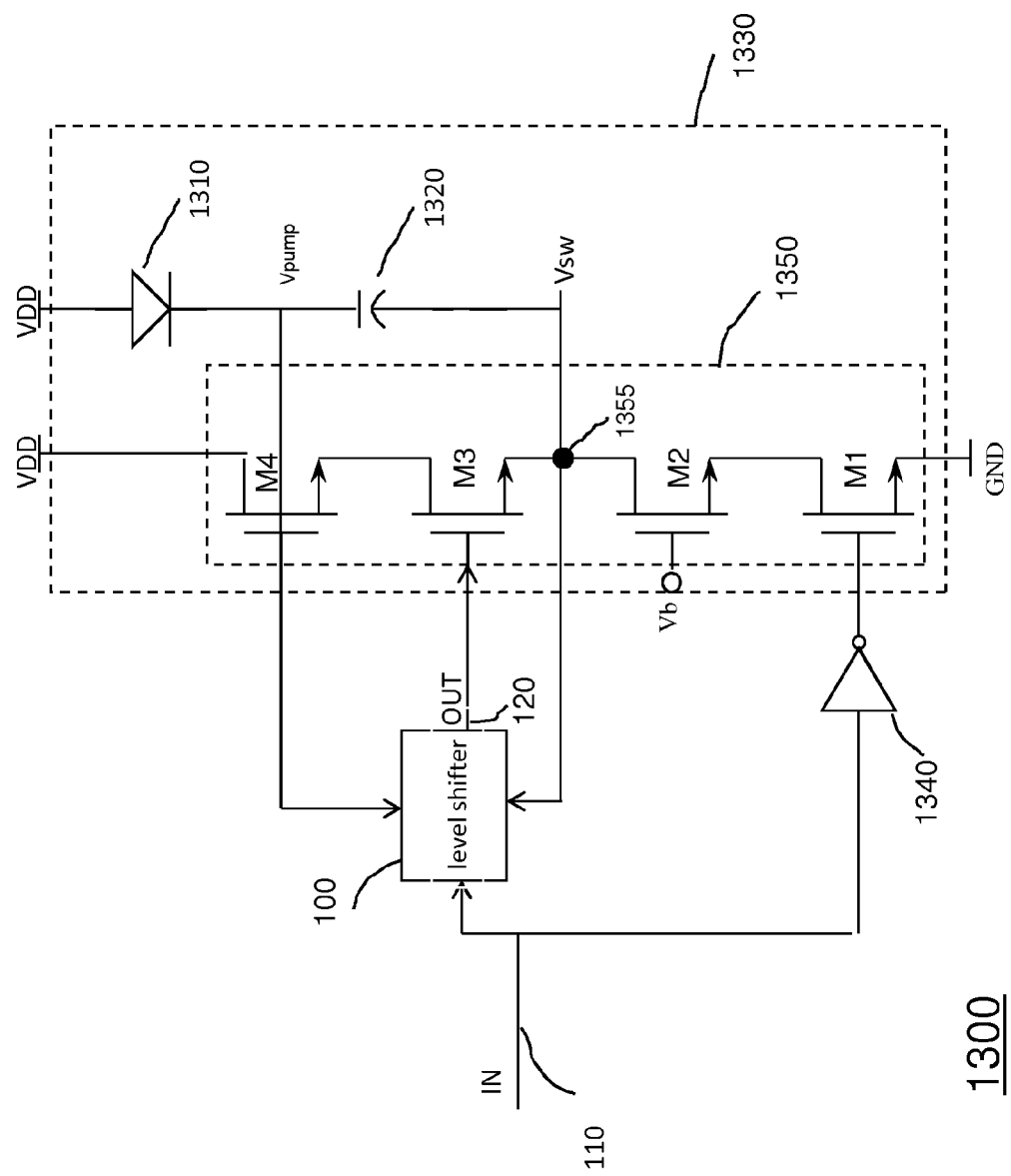
FIG. 13 shows a circuital arrangement when a level shifter according to an embodiment of the disclosure is connected to a bootstrapped inverter.

FIG. 13 shows a circuital arrangement (1300) comprising the level shifter (100) connected to a bootstrapped inverter (1330). A bootstrapped inverter is an inverter coupled with a bootstrap circuit. A bootstrap circuit allows the inverter to keep the inverter devices in an ON state by generating the required threshold voltages. In the embodiment of FIG. 13 the bootstrap circuit comprises a diode (1310) connected to a voltage source VDD and a capacitor (1320) connected between the diode (1310) and an output (1355) of the inverter (1350). The circuital arrangement (1300) generates the control signal Vsw and the signal Vpump (already described in the previous figures) that will be used by the level shifter (100) during operation. In the embodiment shown in FIG. 13, the inverter (1350) comprises, by way of example and not of limitation, a stack of four NMOS devices (M1, M2, M3, M4).

Referring to FIG. 13, the level shifter output terminal (120) is connected to the gate of the device (M3). The device (M2) is biased through its gate with a bias voltage Vb. The level shifter input terminal (110) is connected to the gate of the device M1 through an inverter (1340). The circuital arrangement (1300) uses a supply voltage VDD. As shown in FIG. 13, the inverter (1350) has an output terminal (1355) where the signal Vsw is generated.

Further referring to FIG. 13, the inverter (1350) is fed with an inverted version of the input signal IN (due to an inverter (1340)) and therefore, according the embodiment shown in FIG. 13, the signal Vsw is a replication of the input signal IN but with a different signal level. In other words, assuming that the input signal IN of FIG. 13 swings between 0 and V1, the output signal (1355) of FIG. 13 swings between 0 and V2, with V2>V1. In the embodiment of FIG. 13, V2=VDD. When the input signal and therefore the signal Vsw is in LOW state, the capacitance (1320) is charged by the supply voltage VDD through the diode D. During this condition, device (M1) and device (M2) are ON, while devices (M3, M4) are OFF. When the input signal and consequently the control signal Vsw go HIGH, the diode D does not conduct any more and a combination of Vsw and the voltage across the charged capacitance produces the signal Vpump. During this condition, devices (M3, M4) are ON, while devices (M1, M2) are OFF. By way of example, the input signal IN and the control signal Vsw respectively swing between GND and 0.5 VDD and between GND and VDD. Based on the same example, the capacitance (1320) is charged up to a voltage of 0.5 VDD and therefore the signal Vpump will swing between 0.5 VDD (when Vsw=GND) and a voltage of 1.5 VDD (when Vsw=VDD) which is higher than the supply voltage VDD.

As can be seen in FIG. 13 and continuing with the same example above, during operation and when the output (1355) of the inverter is in HIGH state (VDD), the signal Vpump and the level shifter output (120) provide the gates of the devices M3 and M4 with voltages (1.5 VDD) larger than the power supply VDD, thus keeping ON the devices M3 and M4.

Therefore, presence of the level shifter (100) in the embodiment of FIG. 13 in combination with the bootstrapping capacitor (1320) allows keeping devices M3 and M4 OFF when the output of the inverter switches to LOW and switching devices M3 and M4 ON when the output of the inverter switches to HIGH.

Referring to FIG. 13, the person skilled in the art will understand other embodiments comprising more than one diode can be envisaged. In other words, the voltage level of the signal Vpump can depend on the number of diodes used and thus be adjustable in accordance with the circumstances. In particular, the higher the number of diodes, the lower the charge accumulated by the capacitor (1320) and consequently the lower the value of the signal Vpump.

With further reference to FIG. 13, the person skilled in the art will appreciate that the circuital arrangement (1300) can be used, for example, as a switching element for switching DC-DC converters. NMOS devices have higher electron mobility than PMOS devices have hole mobility. As a result, all-NMOS inverters such as the inverter (1350) are more efficient (i.e., they have smaller ON state resistance) than conventional inverters made of a combination of NMOS and PMOS devices.

The person skilled in the art will understand, upon reading of the present disclosure, that various alternatives can be provided to the embodiment of FIG. 3, where three V-I converters and two I-V converters have been shown. For example, V-I converters can be replaced with I-V converters and vice versa.

In other embodiments of the disclosure, the first IV converter (330) or the second IV converter (340) can be represented by resistors. Using the resistors in the other embodiments, will result in a continuous current flow in the resistors even if the output (120) is not switching. The benefit of using cross coupled inverters instead of resistors is therefore a lower power consumption.

In yet another embodiment of the disclosure, a stack of more than 2 devices used as cascode devices could be envisioned. Referring to FIG. 11 and FIG. 12, and by way of example, each of the cascode devices (M72), (M73), (M74) and (M75), could be replaced by a stack of two or more devices. Referring to FIG. 11, if a stack of N devices is used, N+1 capacitors and resistors could be used to generate N bias voltages for the devices used in the stack.

A dual path level shifter and related devices, methods, and techniques have been described. While the level shifter has been described by means of specific embodiments and applications thereof, it is understood that numerous modifications and variations could be made thereto by those skilled in the art without departing from the spirit and scope of the disclosure. It is therefore to be understood that within the scope of the claims, the disclosure may be practiced otherwise than as specifically described herein.

What is claimed is:

1. A dual path level shifter comprising:
a dual path level shifter input terminal;
a dual path level shifter output terminal;
a first voltage-to-current converter;
a second voltage-to-current converter;
a third voltage-to-current converter;
a first current-to-voltage converter; and
a second current-to-voltage converter,
wherein:
in a first condition, during operation, an input signal having an input signal level swinging between an input signal low voltage level and an input signal high voltage level is routed from the dual path level shifter input terminal to an input of the first voltage-to-current-converter, from an output of the first voltage-to-current-converter to an input of the second current-to-voltage converter, from an output of the second current-to-voltage converter to an input of the third voltage-to-current converter, from an output of the third voltage-to-current converter to an input of the first current-to-voltage converter and from the output of the first current-to-voltage converter to the dual path level shifter output terminal;
in a second condition, during operation, the input signal is routed from the dual path level shifter input terminal to an input of the second voltage-to-current converter, from an output of the second voltage-to-current converter to the input of the first current-to-voltage converter and from the output of first current-to-voltage converter to the dual path level shifter output terminal;
during operation in the second condition, no current is flowing through an electrical path defined by the input signal routing of the first condition;
the output signal is a replicate of the input signal swinging between an output signal low voltage level and an output signal high voltage level, so that the output signal low/high level is a shifted version of the input signal low/high level; and
the output signal during operation in the first condition is different from the output signal during operation in the second condition.

2. The dual path level shifter of claim 1, wherein during operation in the second condition, the output signal low voltage level is higher than the input signal high voltage level and the output signal high voltage level is higher than a voltage level of a power supply powering the dual path level shifter, and wherein during operation in the first condition, the output signal low/high voltage level is the same as the input signal low/high voltage level.

3. The dual path level shifter of claim 1, wherein the first voltage-to-current converter, the second voltage-to-current converter, the third voltage-to-current converter, the first current-to-voltage converter and the second current-to-voltage converter comprise MOSFET devices.

4. The dual path level shifter of claim 3, wherein in the first condition and the second condition, during operation, the MOSFET devices are configured such that the junctions of the MOSFET devices do not experience signal levels larger than a stress threshold level.

5. The dual path level shifter of claim 4, wherein the stress threshold level is higher than the input signal level and lower than the output signal level.

6. The dual path level shifter of claim 3, wherein in the first condition and the second condition, during operation, the MSOFET device are configured such that the junctions of the MOSFET devices do not experience signal levels higher than the input signal level.

7. The dual path level shifter of claim 1, wherein operation in the first condition or the second condition depends on a voltage level of a first control signal input to the dual path level shifter.

8. The dual path level shifter of claim 7, wherein during operation in the second condition the output signal high voltage level is provided by a second control signal and the output signal low voltage level is provided by the first control signal.

9. The dual path level shifter of claim 1, wherein the first voltage-to-current converter comprises cascode devices.

10. The dual path level shifter of claim 1, wherein the second current-to-voltage converter comprises cascode devices.

11. A level shifting method comprising:
providing an input signal having an input signal level swinging between an input signal low voltage level and an input signal high voltage level;
providing an output terminal;
providing a first signal path comprising a plurality of MOSFET devices;
providing a second signal path comprising a plurality of MOSFET devices;
routing, in a first condition, the input signal to the output terminal through the first signal path without shifting the input signal low/high voltage level, and
routing, in a second condition, the input signal to the output terminal through the second path by shifting the input signal low/high voltage level to a voltage level higher than the input signal high voltage level while deactivating the first signal path,
wherein:
in the first and second condition, the MOSFET devices are configured such that junctions of each MOSFET device experience voltage levels not higher than a stress threshold level.

12. The level shifting method of claim 11, wherein operation in the first condition or the second condition depends on status of a switching signal.

13. The level shifting method of claim 11, wherein the stress threshold level is higher than the input signal level and lower than the output signal level.

14. A level shifting method comprising:
providing an input signal having an input signal level swinging between an input signal low voltage level and an input signal high voltage level;
providing an output terminal;
providing a first signal path comprising a plurality of MOSFET devices;
providing a second signal path comprising a plurality of MOSFET devices;
routing, in a first condition, the input signal to the output terminal while conserving the input signal low/high voltage levels, and
routing, in a second condition, the input signal to the output terminal while shifting the input signal low/high voltage levels and based on the shifting, generating output signal low/high voltage levels higher than the input signal high voltage level,
wherein:
in the first condition and second condition, the MOSFET devices are configured such that junctions of each MOSFET device experience voltage levels not higher than the input signal level; and
in the second condition, the first signal path is deactivated by turning OFF a plurality of MOSFET devices of the first signal path.

15. A level shifter circuit comprising a first input terminal, a second input terminal, a third input terminal and an output terminal, wherein:
the first input terminal receives, in operation, an input signal swinging up to a first signal level;
the second input terminal receives, in operation, a control signal swinging up to a second signal level higher than the first signal level;
the third input terminal receives, in operation, a pumping signal swinging between the first signal level and a third signal level higher than the second signal level;
the output terminal outputs, in operation, an output signal swinging between the second signal level and the third signal level when the control signal is at the second signal level and the pumping signal is at the third signal level.

16. The level shifter circuit of claim 15, wherein the control signal decides a signal path of the input signal inside the level shifter circuit.

17. The level shifter circuit of claim 15, wherein the output signal is a replica of the input signal when the control signal is not at the second signal level and the pumping signal is not at the third signal level.

18. The level shifter circuit of claim 15, connected, in operation, to a supply voltage, wherein the third signal level is higher than the supply voltage.

19. The level shifter circuit of claim 15, connected, in operation, to a supply voltage VDD wherein: the first signal is 0.5 VDD, the second signal level is VDD, and the third signal level is 1.5 VDD.

20. A dual path level shifter comprising:
a dual path level shifter input terminal;
a dual path level shifter output terminal;
a first current-to-voltage converter;
a second current-to-voltage converter;
a third current-to-voltage converter;
a first voltage-to-current converter; and
a second voltage-to-current converter,
wherein:
in a first condition, during operation, an input signal having an input signal level swinging between an input signal low current level and an input signal high current level is routed from the dual path level shifter input terminal to an input of the first current-to-voltage converter and from output of the first current-to-voltage converter to an input of the second voltage-to-current converter and from an output of the second voltage-to-current converter to an input of the third current-to-voltage converter and from an output of the third current-to-voltage converter to an input of the first voltage-to-current converter and from the output of the first voltage-to-current converter to the dual path level shifter output terminal;
in a second condition, during operation, the input signal is routed from the dual path level shifter input terminal to an input of the second current-to-voltage converter and from an output of the second current-to-voltage converter to an input of the first voltage-to-current converter and from an output of the first voltage-to-current converter to the dual path level shifter output terminal;

during operation in the second condition, no current is flowing through an electrical path defined by the input signal routing of the first condition;

the output signal is a replicate of the input signal swinging between an output signal low current level and an output signal high current level, so that the output signal low/high level is a shifted version of the input signal low/high level; and the output signal during operation in the first condition is different from the output signal during operation in the second condition.

21. The dual path level shifter of claim 20, wherein during operation in the second condition, the output signal low current level is higher than the input signal high current level and the output signal high current level is higher than a current level of a power supply powering the dual path level shifter, and wherein during operation in the first condition, the output signal low/high current level is the same as the input signal low/high current level.

22. The dual path level shifter of claim 20, wherein the first current-to-voltage converter, the second current-to-voltage converter, the third current-to-voltage converter, the first voltage-to-current converter and the second voltage-to-current converter comprise MOSFET devices.

23. The dual path level shifter of claim 22, wherein in the first condition and the second condition, during operation, the MOSFET devices are configured so that junctions of the MOSFET devices will not experience signal levels larger than a stress threshold level.

24. The dual path level shifter of claim 23, wherein the stress threshold level is higher than the input signal level and lower than the output signal level.

25. The dual path level shifter of claim 22, wherein in the first condition and the second condition, during operation, the MOSFET devices are configured such that junctions of the MOSFET devices will not experience signal levels higher than the input signal level.

26. The dual path level shifter of claim 20, wherein operation in the first condition or the second condition depends on a voltage level of a first control signal input to the dual path level shifter.

27. The dual path level shifter of claim 22, wherein during operation in the second condition the output signal high current level is provided by a second control signal and the output signal low current level is provided by the first control signal.

* * * * *